US012721193B2

(12) United States Patent
Marin et al.

(10) Patent No.: US 12,721,193 B2
(45) Date of Patent: Aug. 25, 2026

(54) SELF-ALIGNMENT OF GLASS CORE HALVES USING PROTRUDED BUMPS

(71) Applicant: Intel Corporation, Santa Clara, CA (US)

(72) Inventors: Brandon C. Marin, Gilbert, AZ (US); Sashi S. Kandanur, Phoenix, AZ (US); Suddhasattwa Nad, Chandler, AZ (US); Srinivas V. Pietambaram, Chandler, AZ (US); Gang Duan, Chandler, AZ (US); Jeremy D. Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 17/893,893

(22) Filed: Aug. 23, 2022

(65) Prior Publication Data

US 2024/0071883 A1 Feb. 29, 2024

(51) Int. Cl.

| | |
|---|---|
| ***H10W 70/63*** | (2026.01) |
| ***H10W 46/00*** | (2026.01) |
| ***H10W 70/65*** | (2026.01) |
| ***H10W 70/685*** | (2026.01) |
| ***H10W 70/692*** | (2026.01) |
| ***H10W 90/00*** | (2026.01) |

(52) U.S. Cl.

CPC ......... *H10W 70/635* (2026.01); *H10W 46/00* (2026.01); *H10W 70/65* (2026.01); *H10W 70/685* (2026.01); *H10W 70/692* (2026.01); *H10W 90/401* (2026.01); *H10W 90/724* (2026.01)

(58) Field of Classification Search

CPC .... H01L 23/15; H10W 70/635; H10W 46/00; H10W 70/65; H10W 70/685; H10W 70/692; H10W 90/401; H10W 90/724; H10W 46/301; H10W 46/607; H10W 70/095

See application file for complete search history.

(56) References Cited

U.S. PATENT DOCUMENTS

| | | | | |
|---|---|---|---|---|
| 2011/0147059 A1* | 6/2011 | Ma | H01L 23/49822 | 156/60 |
| 2011/0217657 A1* | 9/2011 | Flemming | H01L 21/486 | 29/874 |
| 2012/0235969 A1* | 9/2012 | Burns | H05K 3/42 | 361/748 |
| 2020/0203266 A1* | 6/2020 | Iwai | H01L 23/49866 | |

* cited by examiner

*Primary Examiner* — Tucker J Wright
(74) *Attorney, Agent, or Firm* — Schwabe, Williamson & Wyatt P.C.

(57) ABSTRACT

Embodiments disclosed herein include cores for package substrates. In an embodiment, the core comprises a first substrate, where the first substrate comprises glass. In an embodiment, the core further comprises a first through glass via (TGV) through the first substrate and a second substrate, where the second substrate comprises glass. In an embodiment, the core further comprises a second TGV through the second substrate, where the first TGV is aligned with the second TGV.

11 Claims, 13 Drawing Sheets

401B 422
451
446
401B 420B
440
401B 422
451
442
401A 420A
449
401A 460
420A
442
401A
460

500
542
501A
541
501B
540
520A
520B
516
516
514
514
512
512
505

SELF-ALIGNMENT OF GLASS CORE HALVES USING PROTRUDED BUMPS

TECHNICAL FIELD

Embodiments of the present disclosure relate to electronic packages, and more particularly to package substrates with glass cores that include two or more aligned sub-layers.

BACKGROUND

Recent trends in electronic packaging architectures are moving towards the use of glass cores. Through glass vias (TGVs) are provided through the glass core in order to route signals and/or power through a thickness of the glass. The TGVs may be formed with a laser assisted patterning process. In such architectures, a laser exposure is used to modify the microstructure and/or phase of the glass. The modified regions of the glass can then be selectively etched in order to form via openings. Typically, for thicker glass cores, a dual sided exposure is used. The dual sided exposure results in an hourglass shaped cross-section. That is, a midpoint of the via opening is narrower than the top and bottom of the via opening.

However, the narrow middle region results in plating difficulties. If the middle region is too narrow, the plating process may result in voids or other defects that diminish the performance of the TGV. This is particularly problematic in high aspect ratio designs that are necessary for thick glass cores. For example, aspect ratios of approximately 10:1 or greater may be difficult to properly plate using existing TGV fabrication processes.

EMBODIMENTS OF THE PRESENT DISCLOSURE

Figure 1A:
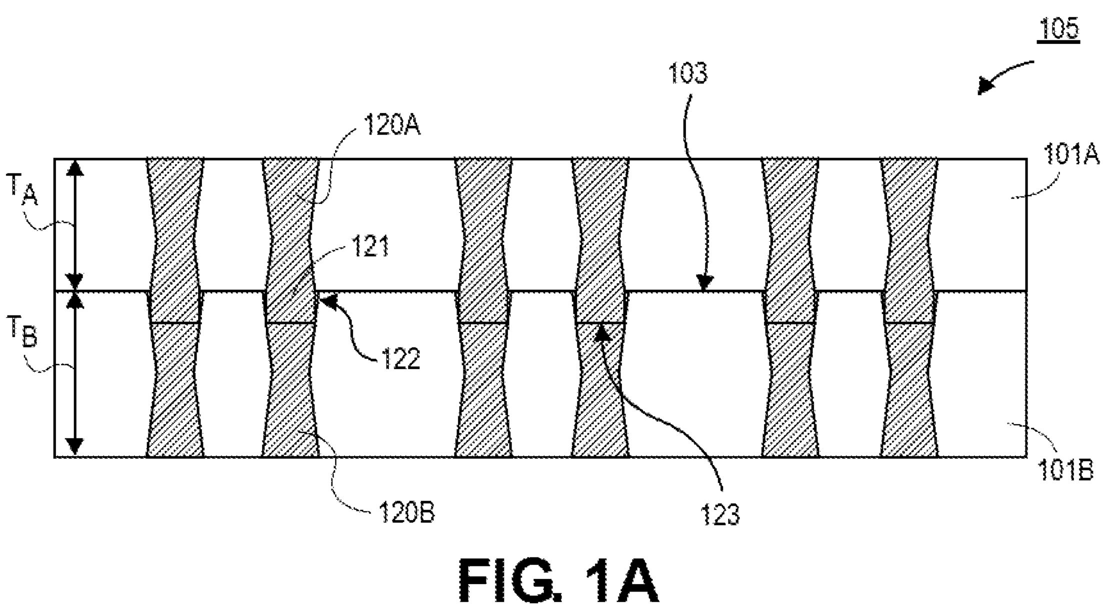
FIG. 1A is a cross-sectional illustration of a core with a first sub-layer and a second sub-layer with TGVs through the first sub-layer and the second sub-layer, in accordance with an embodiment.

Described herein are package substrates with glass cores that include two or more aligned sub-layers, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, it is currently difficult to provide high aspect ratio (height:width) through glass vias (TGVs) in glass core architectures. As used herein, high aspect ratios may be aspect ratios of 5:1 or greater, 10:1 or greater, or 20:1 or greater. In existing solutions, the high aspect ratio features have midpoints that are too narrow. As such, voids or other defects are generated and lead to diminished performance of the TGVs. In some solutions, the core is split into sub-layers, that are then bonded together. For example, each sub-layer may include TGVs with smaller aspect ratios, and then the TGVs in each sub-layer are bonded together in order to fabricate higher aspect ratio features. However, there are difficulties with aligning the glass sub-layers.

Accordingly, embodiments disclosed herein include glass sub-layers that are aligned with alignment features. This allows for lower aspect ratio features to be formed and coupled together in order to provide high aspect ratio TGVs. The alignment may be implemented using features of the TGVs themselves. For example, a first sub-layer may have TGVs with protrusions past a surface of the first sub-layer, and a second sub-layer may have TGVs with recesses. The protrusions can then insert into the recesses in order to provide mechanical alignment between the first sub-layer and the second sub-layer. In other embodiments dedicated alignment features may be provided. For example, alignment vias with protrusions may be formed in one sub-layer, and alignment notches may be formed in the other sub-layer. The protrusions insert into the notches in order to provide mechanical alignment between the two sub-layers.

In an embodiment, the combined high aspect ratio TGVs may have any suitable cross-section. In the case of laser assisted patterning, the TGVs may have a repeating hourglass shaped cross-section. That is, the TGVs may have a first hourglass shaped cross-section in one sub-layer and a second hourglass shaped cross-section in a second sub-layer. In such an embodiment, there may be two narrow regions within a single TGV structure. Additionally, while embodiments disclosed herein describe cores with two sub-layers, it is to be appreciated that similar alignment structures may be used to couple together three or more sub-layers in order to provide even higher aspect ratios.

Referring now to FIG. 1A, a cross-sectional illustration of a core 105 is shown, in accordance with an embodiment. In an embodiment, the core 105 may comprise glass. That is, the core 105 may be a glass core, or a core 105 that is substantially all glass. This is different than organic cores that may include glass reinforcement fibers. In an embodiment, the core 105 may comprise two or more sub-layers 101A and 101B. The sub-layers 101A and 101B may be coupled together in order to provide thicker cores 105. Particularly, TGVs 120A and 120B may be provided through the sub-layers 101A and 101B in order to provide high aspect ratio structures. For example, TGVs 120A and 120B may have aspect ratios that are approximately 5:1 (height: width) or less, or 10:1 or less. As such, the TGVs 120A and 120B are able to be fully plated without voids or other defects. When coupled together, the TGVs 120A and 120B are able to have high aspect ratios (e.g., 10:1 or greater, or 20:1 or greater).

In an embodiment, the sub-layers 101A and 101B may include glass that is patternable with a laser assisted etching process. In such architectures, a laser exposure is used to modify the microstructure and/or phase of the glass in the sub-layers 101A and 101B. The modified regions of the glass can then be selectively etched in order to form via openings. Typically, for thicker glass cores, a dual sided exposure is used. The dual sided exposure results in an hourglass shaped cross-section. That is, a midpoint of the via opening is narrower than the top and bottom of the via opening.

In an embodiment, the first sub-layer 101A may have a first thickness TA, and the second sub-layer 101B may have a second thickness TB. The first thickness TA may be smaller than the second thickness TB. The reduced thickness of the first sub-layer 101A allows for protrusions 121 to extend out past a surface of the first sub-layer 101A. The protrusion 121 may then insert into a recess 122 over the second TGVs 120B. The protrusion 121 may be bonded to the TGV 120B with a diffusion bonding process. That is, the TGV 120A may be directly bonded to the TGV 120B. In an embodiment, the protrusion 121 and recess 122 architecture results in the interface 123 between the TGVs 120A and 120B being non-planar with the interface 103 between the first sub-layer 101A and the second sub-layer 101B. For example, the interface 123 may be below the interface 103 (in the Z-direction). The protrusion 121 and recess 122 architecture allows for mechanical alignment of the first sub-layer 101A and the second sub-layer 101B. As used herein, two TGVs 120 that are aligned refers to the centerlines of the two TGVs 120 being within 2 μm of each other. That is to say, while the alignment provided herein allows for extremely tight alignment tolerances, there may be some degree of misalignment due to manufacturing variability. Additionally, it is to be appreciated that the height of the TGVs 120A may be greater than the height of the TGVs 120B. For example, a difference in the height of the TGVs 120A and 120B may be substantially equal to a difference in the thickness TA of the first sub-layer 101A and the thickness TB of the second sub-layer 101B.

Figure 1B:
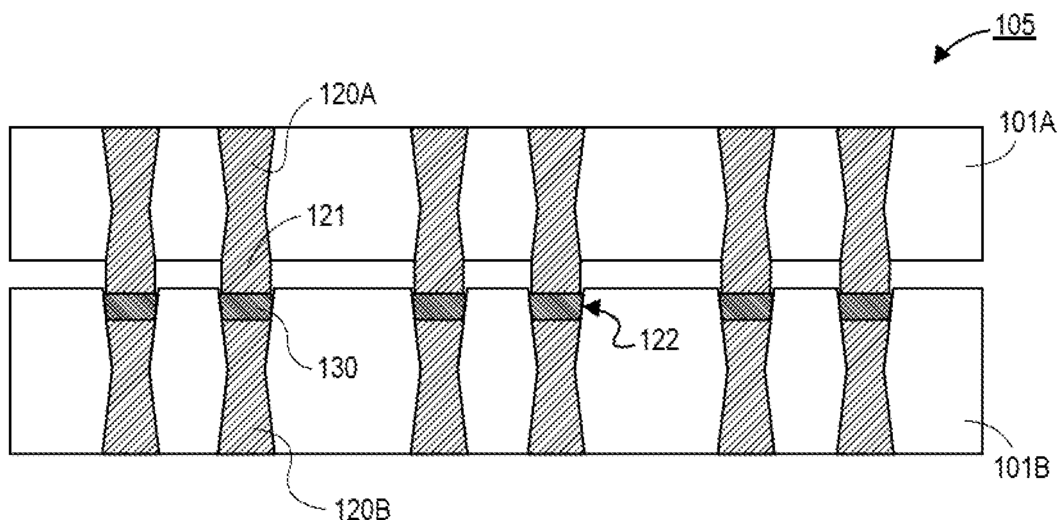
FIG. 1B is a cross-sectional illustration of a core with a first sub-layer and a second sub-layer with TGVs that are coupled together by solder, in accordance with an embodiment.

Referring now to FIG. 1B, a cross-sectional illustration of a core 105 is shown, in accordance with an additional embodiment. In an embodiment, the core 105 in FIG. 1B may be substantially similar to the core 105 in FIG. 1A with the exception of the interface between the first TGVs 120A and the second TGVs 120B. Instead of a diffusion bonded interface, the first TGVs 120A may be bonded to the second TGVs 120B using a solder 130 or the like. In the illustrated embodiment, the solder 130 results in a gap being formed between the first sub-layer 101A and the second sub-layer 101B. However, in other embodiments, the recess 122 may be increased in depth in order to fully accommodate the thickness of the solder 130, and this allows for the first sub-layer 101A to directly bond to the second sub-layer 101*n*.

Figure 2:
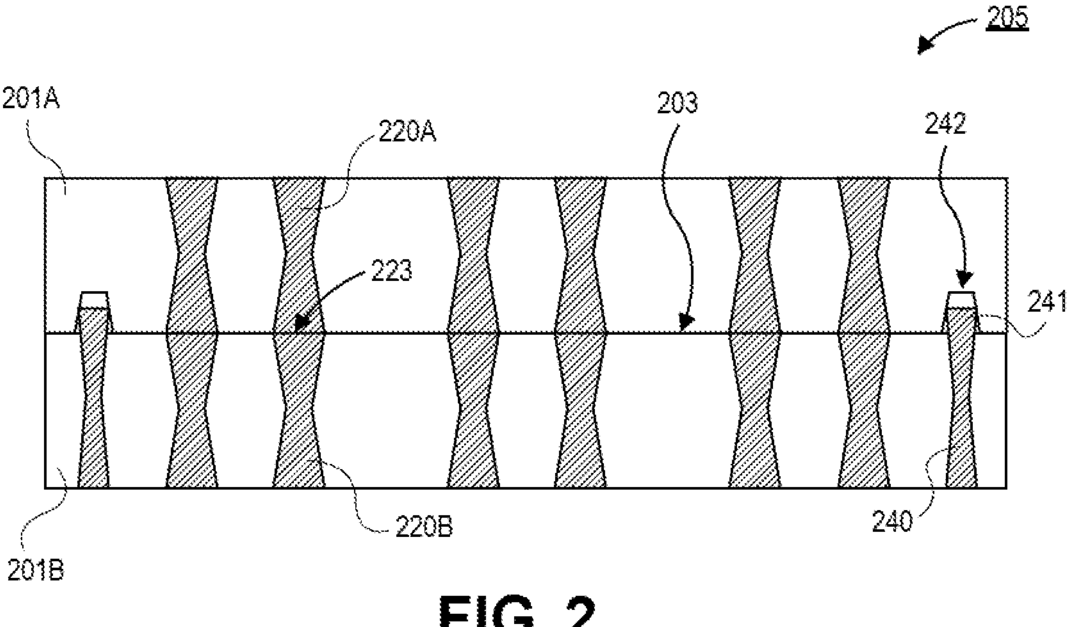
FIG. 2 is a cross-sectional illustration of a core with sub-layers that include an alignment via and an alignment notch in order to properly align the TGVs, in accordance with an embodiment.

Referring now to FIG. 2, a cross-sectional illustration of a core 205 is shown, in accordance with an embodiment. In an embodiment, the core 205 comprises a first sub-layer 201A and a second sub-layer 201B. The first sub-layer 201A and the second sub-layer 201B may comprise glass. In an embodiment, first TGVs 220A may be formed in the first sub-layer 201A, and second TGVs 220B may be formed in the second sub-layer 201B. In an embodiment, an interface 223 between the first TGVs 220A and the second TGVs 220B may include diffusion bonding. Additionally, the interface 223 may be substantially coplanar with an interface 203 between the first sub-layer 201A and the second sub-layer 201B. The first sub-layer 201A and the second sub-layer 201B may have the same thickness in some embodiments. Additionally, the first TGVs 220A may have the same heights as the second TGVs 220B.

In an embodiment, alignment between the first TGVs 220A and the second TGVs 220B may be provided by mechanical alignment features. Particularly, alignment vias 240 may be provided in the second sub-layer 201B. The alignment vias 240 may include protrusions 241 that extend past a surface of the second sub-layer 201B. The protrusion 241 may insert into a notch 242 in the first sub-layer 201A. In such an embodiment, mechanical alignment is provided without needing to modify the structure of the TGVs 220A and 220B. In an embodiment, centerlines of the aligned TGVs 220A and 220B may be within 2 μm of each other. That is to say, while the alignment provided herein allows for extremely tight alignment tolerances, there may be some degree of misalignment due to manufacturing variability.

Referring now to FIGS. 3A-3K a series of cross-sectional illustrations depicting a process for fabricating a core 305 is shown, in accordance with an embodiment. In an embodiment, the core 305 may be similar to the core 105 shown in FIG. 1A.

Figure 3A:
FIGS. 3A-3K are cross-sectional illustrations depicting a process for forming glass cores with aligned TGVs, in accordance with an embodiment.

Referring now to FIG. 3A, a cross-sectional illustration of a sub-layer 301B is shown, in accordance with an embodiment. In an embodiment, the sub-layer 301B may comprise glass. That is, the sub-layer 301B may be a glass sub-layer 301B. The sub-layer 301B may have any suitable thickness. In an embodiment, the thickness of the sub-layer 301B may be between approximately 10 μm and approximately 500 μm. As used herein, “approximately” may refer to a range of values within ten percent of the stated value. For example, approximately 10 μm includes a range between 9 μm and 11 μm. In an embodiment, the sub-layer 301B may comprise a glass material that is compatible with laser assisted patterning processes. For example, the glass material may comprise a fused silica glass, a borosilicate glass, or the like.

Figure 3B:
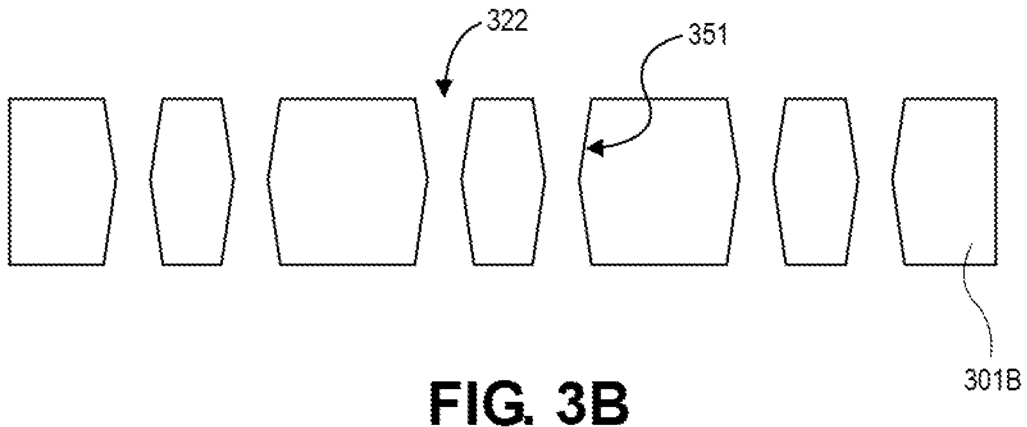

Referring now to FIG. 3B, a cross-sectional illustration of the sub-layer 301B after via openings 322 are formed is shown, in accordance with an embodiment. In an embodiment, the via openings 322 may be formed with a laser assisted patterning process. As is typical in such processes, sidewalls 351 of the via openings 322 may be tapered. In the case of a dual sided patterning process, the via openings 322 may have a cross-section that is an hourglass shaped cross-section. That is, the midpoints of the via openings 322 are narrower than the ends of the via openings 322. In an embodiment, the via openings 322 may have an aspect ratio of 5:1 or greater, or 10:1 or greater.

Figure 3C:
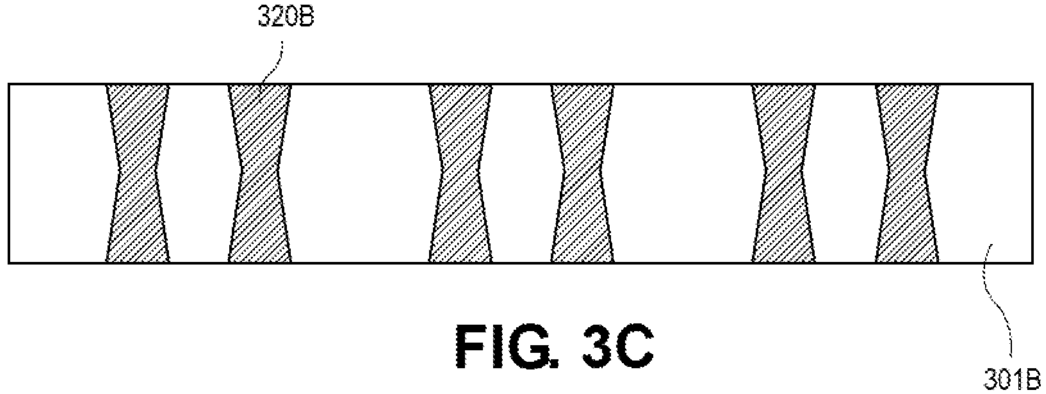

Referring now to FIG. 3C, a cross-sectional illustration of the sub-layer 301B after TGVs 320B are plated in the via openings 322 is shown, in accordance with an embodiment.

In an embodiment, the TGVs 320B may be plated with any suitable plating process (e.g., electrolytic plating, electroless plating, etc.). In some embodiments, seed layers (not shown) may also be provided along sidewalls of the via openings 322 in order to plate the TGVs 320B. Portions of the seed layer that are over top and bottom surfaces of the sub-layer 301B may be removed with a flash etching process or the like. The TGVs 320B conform to the shape of the via openings 322, and may have an hourglass shaped cross-section.

Figure 3D:
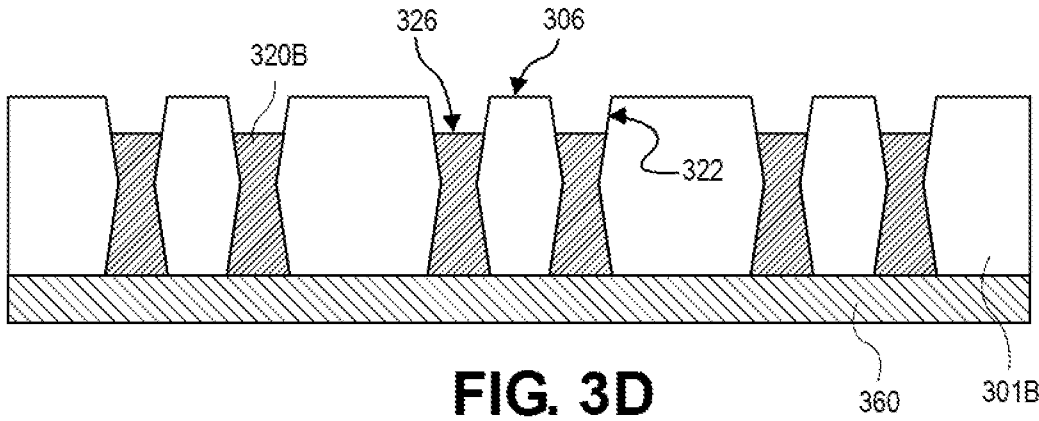

Referring now to FIG. 3D, a cross-sectional illustration of the sub-layer 301B after a recessing operation is shown, in accordance with an embodiment. In an embodiment, a mask layer 360 may be applied over a bottom surface of the sub-layer 301B. The mask layer 360 protects the bottom of the TGVs 320B from the etching process. A timed etching (e.g., a wet etching process) may then be used in order to recess the top of the TGVs 320B. The top surfaces 326 of the TGVs 320B may be below the top surface 306 of the sub-layer 301B. Recessing the TGVs 320B result in portions of the via opening 322 being re-exposed.

Figure 3E:

Referring now to FIG. 3E, a cross-sectional illustration of a sub-layer 301A is shown, in accordance with an embodiment. In an embodiment, the sub-layer 301A may comprise glass. That is, the sub-layer 301A may be a glass sub-layer 301A. The sub-layer 301A may have any suitable thickness. In an embodiment, the thickness of the sub-layer 301A may be between approximately 10 μm and approximately 500 μm. In an embodiment, the sub-layer 301A may comprise a glass material that is compatible with laser assisted patterning processes. For example, the glass material may comprise a fused silica glass, a borosilicate glass, or the like.

Figure 3F:
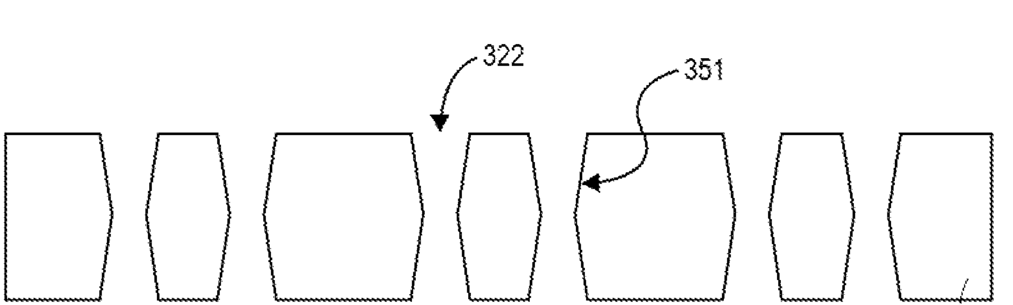

Referring now to FIG. 3F, a cross-sectional illustration of the sub-layer 301A after via openings 322 are formed is shown, in accordance with an embodiment. In an embodiment, the via openings 322 may be formed with a laser assisted patterning process. As is typical in such processes, sidewalls 351 of the via openings 322 may be tapered. In the case of a dual sided patterning process, the via openings 322 may have a cross-section that is an hourglass shaped cross-section. That is, the midpoints of the via openings 322 are narrower than the ends of the via openings 322. In an embodiment, the via openings 322 may have an aspect ratio of 5:1 or greater, or 10:1 or greater.

Figure 3G:
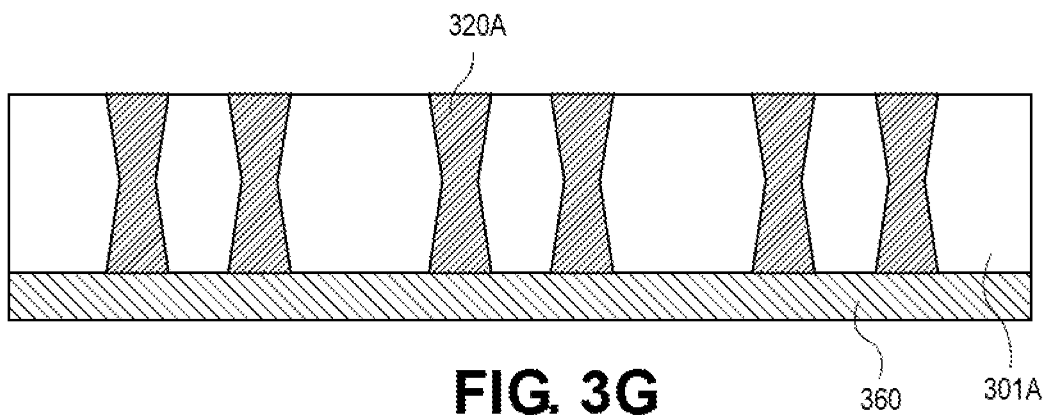

Referring now to FIG. 3G, a cross-sectional illustration of the sub-layer 301A after TGVs 320A are plated in the via openings 322 is shown, in accordance with an embodiment. In an embodiment, the TGVs 320A may be plated with any suitable plating process (e.g., electrolytic plating, electroless plating, etc.). In some embodiments, seed layers (not shown) may also be provided along sidewalls of the via openings 322 in order to plate the TGVs 320A. Portions of the seed layer that are over top and bottom surfaces of the sub-layer 301A may be removed with a flash etching process or the like. The TGVs 320A conform to the shape of the via openings 322, and may have an hourglass shaped cross-section. In an embodiment, a mask layer 360 may be applied under the TGVs 320A after plating.

Figure 3H:
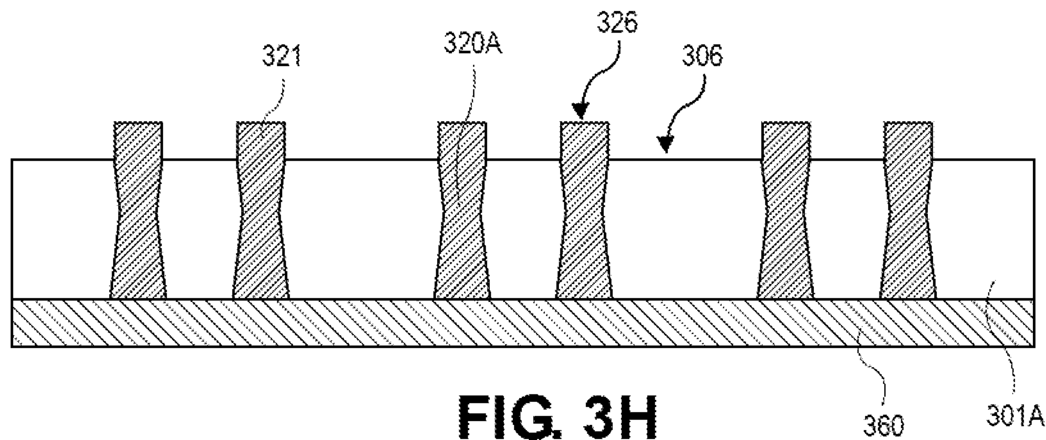

Referring now to FIG. 3H, a cross-sectional illustration of the sub-layer 301A after a recessing process is shown, in accordance with an embodiment. In an embodiment, the recessing process is a glass recessing operation. That is, the surface 306 of the sub-layer 301A is etched back. This allows for protrusions 321 of the TGVs 320 to extend up above the surface 306 of the sub-layer 301A. As shown, top surface 326 of the TGVs 320A are above the top surface 306 of the sub-layer 301A. In an embodiment, the recess of surface 306 may be a distance substantially equal to a distance of the recess of the TGVs 320B shown in FIG. 3D.

Figure 3I:
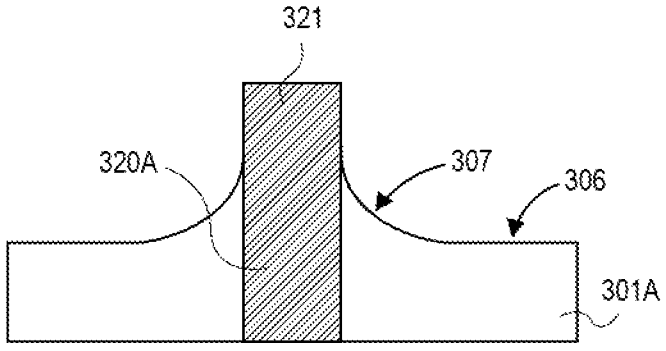

Referring now to FIG. 3I, a zoomed in cross-sectional illustration of a protrusion 321 is shown, in accordance with an embodiment. In an embodiment, the protrusion 321 extends up above the top surface 306 of the sub-layer 301A. Additionally, in some embodiments a curved surface 307 may be provided adjacent to the TGV 320A. That is, the recessing of the sub-layer 301A may not be perfectly flat. Portions of the sub-layer 301A proximate to the TGV 320A may not etch as much as portions of the sub-layer 301A further from the TGV 320A. Accordingly, the curved surface is formed.

Figure 3J:
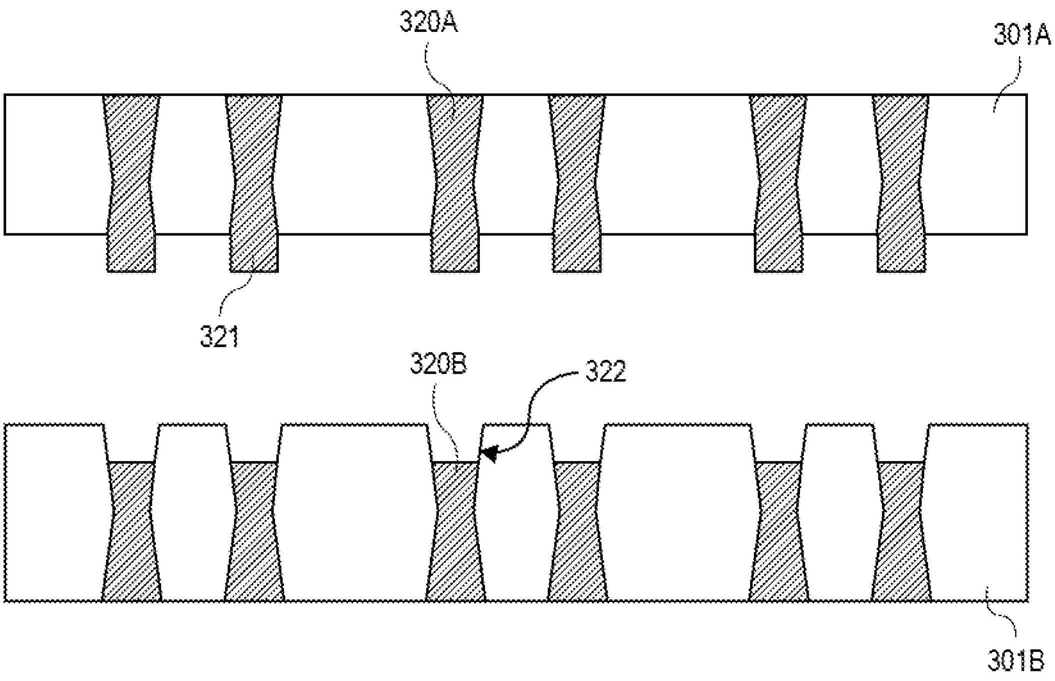

Referring now to FIG. 3J, a cross-sectional illustration of the sub-layer 301A and the sub-layer 301B is shown, in accordance with an embodiment. As shown, the TGVs 320A are aligned over the TGVs 320B. The sub-layer 301A is flipped over so that the protrusions 321 are facing down towards the via openings 322 in the sub-layer 301B.

Figure 3K:
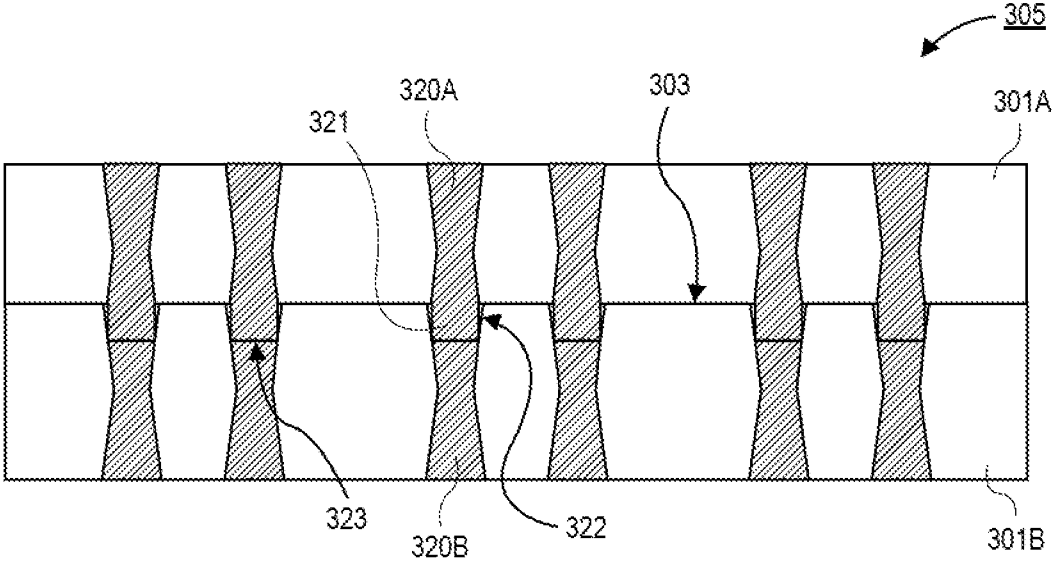

Referring now to FIG. 3K, a cross-sectional illustration of the core 305 after the sub-layer 301A is coupled to the sub-layer 301B. As shown, protrusions 321 are inserted into the via openings 322. The protrusion 321 and via opening 322 architecture allows for the TGVs 320A to be properly aligned with the TGVs 320B. In an embodiment, the TGVs 320A may be bonded to the TGVs 320B with a diffusion bonding process to form interfaces 323. In an embodiment, the sub-layers 301A and 301B may also be bonded to each other at interface 303. The interface 303 may be at a different Z-height than the interfaces 323. In some embodiments, the bonding between the sub-layer 301A and the sub-layer 301B may be referred to as a hybrid bonding architecture since the bond includes both a metal-to-metal bond (i.e., interface 323) and a glass-to-glass bond (i.e., interface 303).

Referring now to FIGS. 4A-4J, a series of cross-sectional illustrations depicting a process for forming a core 405 is shown, in accordance with an embodiment. In an embodiment, the core 405 may be substantially similar to the core 205 as shown in FIG. 2.

Figures 4A, 4B, 4C:
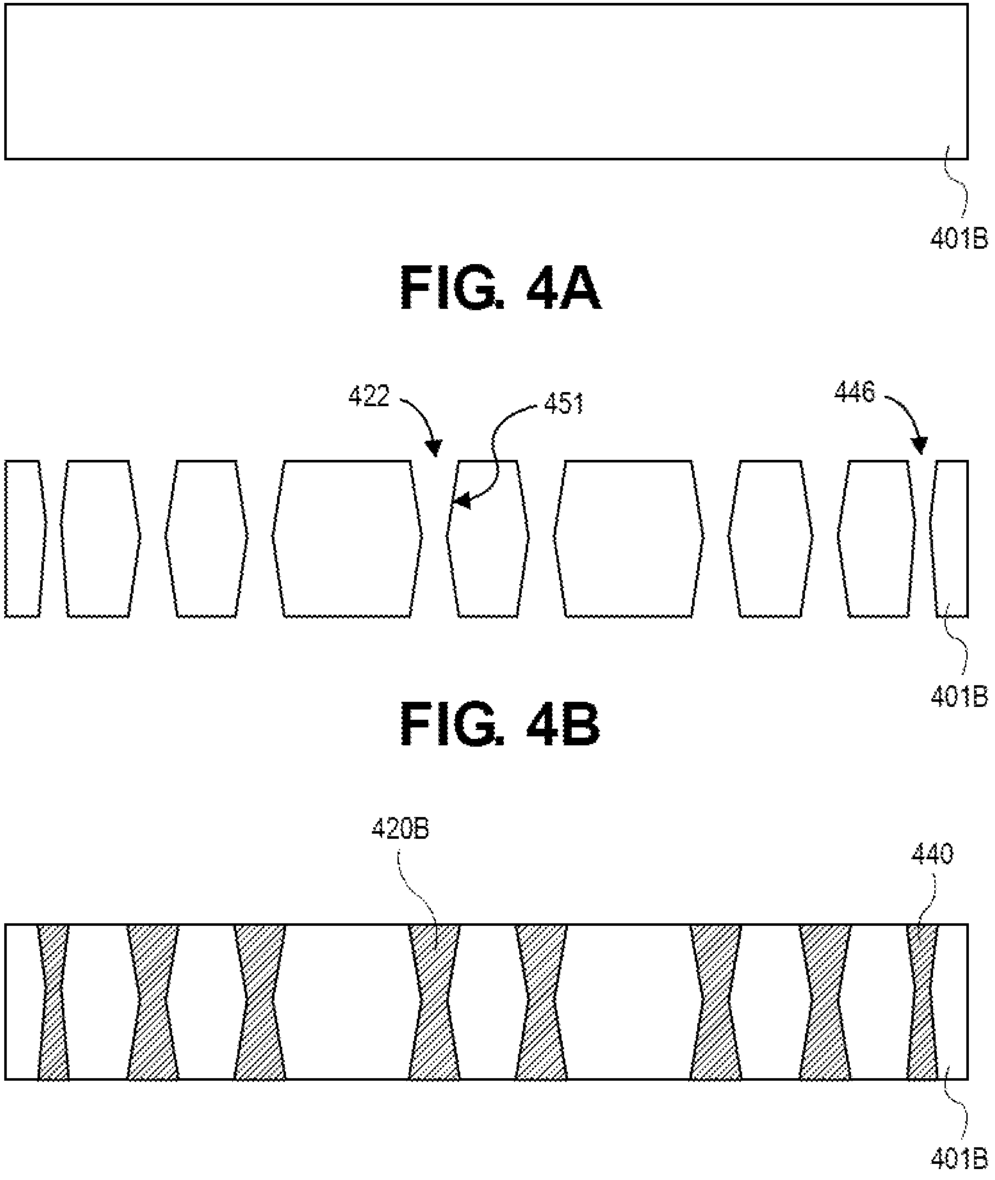
FIGS. 4A-4J are cross-sectional illustrations depicting a process for forming glass cores with TGVs that are aligned with an alignment via and an alignment notch, in accordance with an embodiment.

Referring now to FIG. 4A, a cross-sectional illustration of a sub-layer 401B is shown, in accordance with an embodiment. In an embodiment, the sub-layer 401B may comprise glass. That is, the sub-layer 401B may be a glass sub-layer 401B. The sub-layer 401B may have any suitable thickness. In an embodiment, the thickness of the sub-layer 401B may be between approximately 10 μm and approximately 500 μm. In an embodiment, the sub-layer 401B may comprise a glass material that is compatible with laser assisted patterning processes. For example, the glass material may comprise a fused silica glass, a borosilicate glass, or the like.

Referring now to FIG. 4B, a cross-sectional illustration of the sub-layer 401B after via openings 422 are formed is shown, in accordance with an embodiment. In an embodiment, the via openings 422 may be formed with a laser assisted patterning process. As is typical in such processes, sidewalls 451 of the via openings 422 may be tapered. In the case of a dual sided patterning process, the via openings 422 may have a cross-section that is an hourglass shaped cross-section. That is, the midpoints of the via openings 422 are narrower than the ends of the via openings 422. In an embodiment, the via openings 422 may have an aspect ratio of 5:1 or greater, or 10:1 or greater.

In an embodiment, the sub-layer 401B may also include alignment openings 446. The alignment openings 446 may be similar in structure to the via openings 422. For example, the alignment openings 446 may have an hourglass shaped cross-section. In other embodiments, the alignment openings 446 may be narrower than the via openings 422.

Referring now to FIG. 4C, a cross-sectional illustration of the sub-layer 401B after TGVs 420B are plated in the via openings 422 is shown, in accordance with an embodiment. In an embodiment, the TGVs 420B may be plated with any suitable plating process (e.g., electrolytic plating, electroless plating, etc.). In some embodiments, seed layers (not shown) may also be provided along sidewalls of the via openings 422 in order to plate the TGVs 420B. Portions of the seed layer that are over top and bottom surfaces of the sub-layer 401B may be removed with a flash etching process or the like. The TGVs 420B conform to the shape of the via openings 422, and may have an hourglass shaped cross-section. Additionally, the plating process may include the formation of the alignment vias 440 in the alignment openings 446.

Figure 4D:
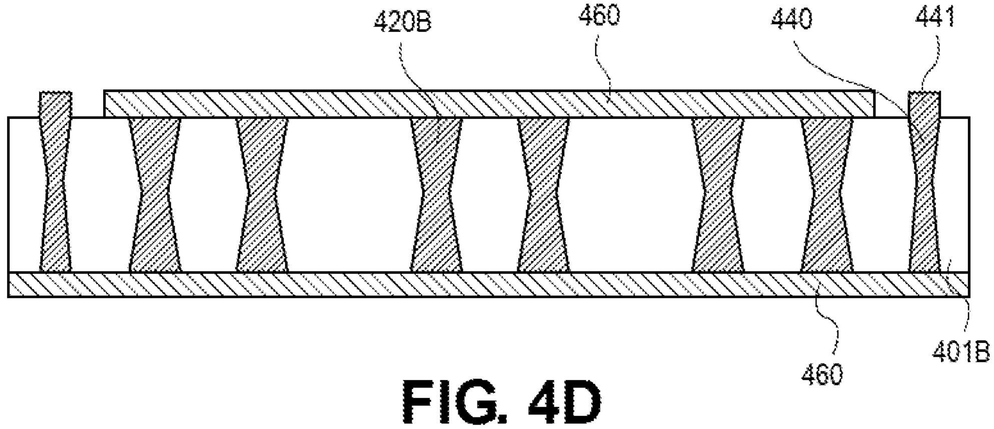

Referring now to FIG. 4D, a cross-sectional illustration of the sub-layer 401B after protrusions 441 are formed over the alignment vias 440 is shown, in accordance with an embodiment. In an embodiment, mask layers 460 may be provided over the top and bottom surfaces of the vias 420B in order to prevent additional plating. The bottom surface of the alignment vias 440 may also be covered by the mask layer 460. As such, only the top surfaces of the alignment vias 440 are exposed. This allows for a plating process to be used in order to form the protrusions 441 that will be used in the alignment to a second sub-layer 401A.

Figure 4E:
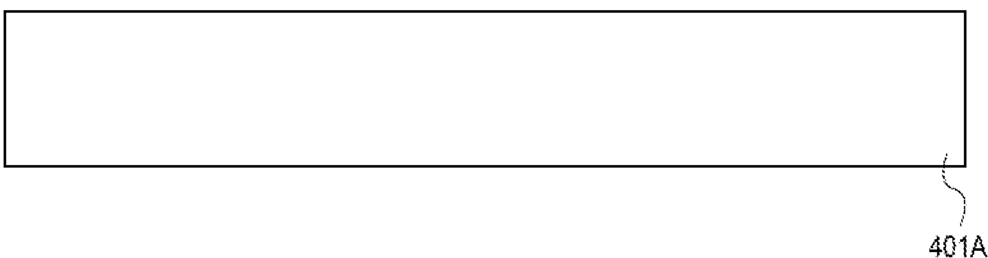

Referring now to FIG. 4E, a cross-sectional illustration of a sub-layer 401A is shown, in accordance with an embodiment. In an embodiment, the sub-layer 401A may comprise glass. That is, the sub-layer 401A may be a glass sub-layer 401A. The sub-layer 401A may have any suitable thickness. In an embodiment, the thickness of the sub-layer 401A may be between approximately 10 μm and approximately 500 μm. In an embodiment, the sub-layer 401A may comprise a glass material that is compatible with laser assisted patterning processes. For example, the glass material may comprise a fused silica glass, a borosilicate glass, or the like.

Figures 4F, 4G, 4H:
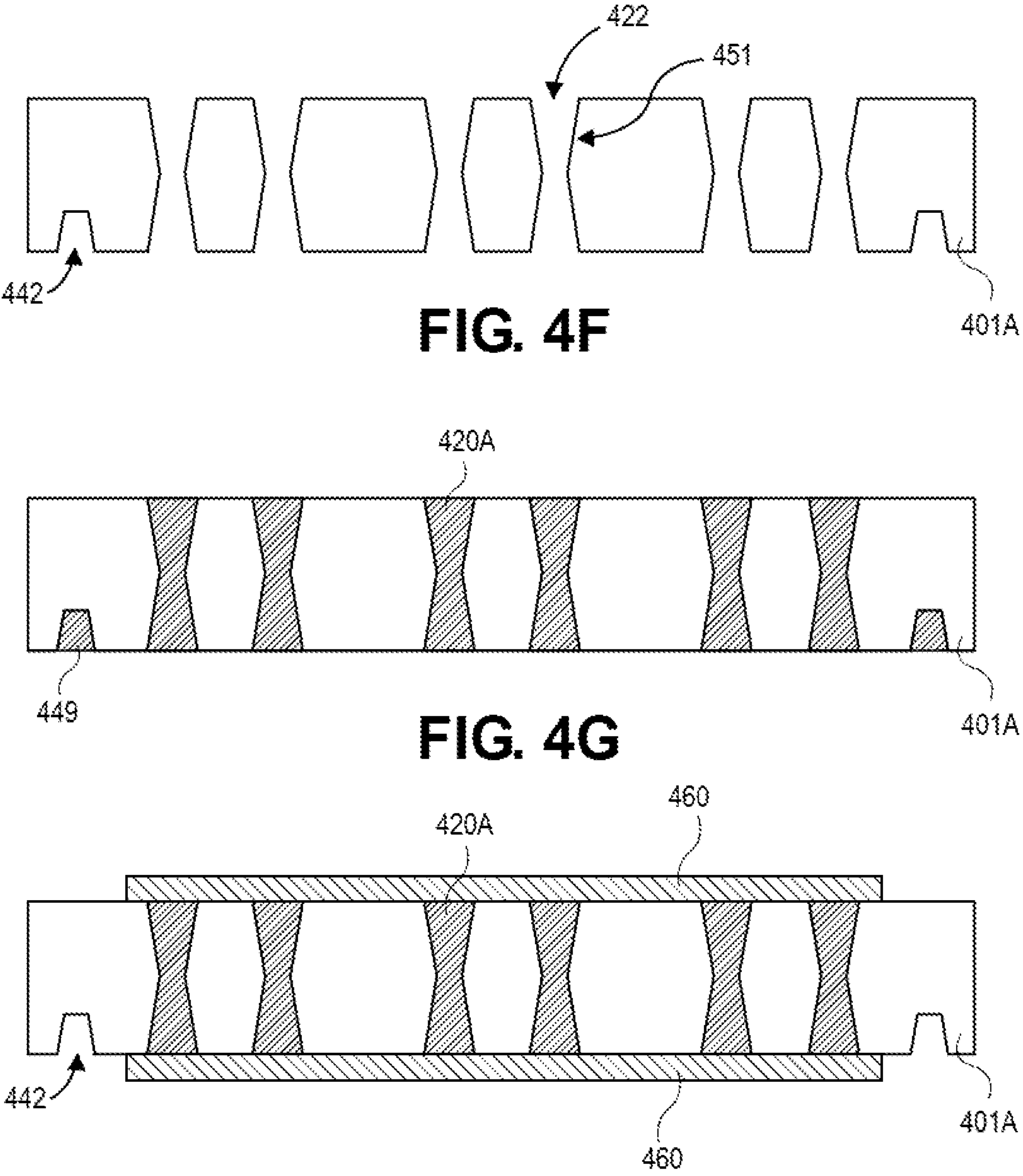

Referring now to FIG. 4F, a cross-sectional illustration of the sub-layer 401A after via openings 422 are formed is shown, in accordance with an embodiment. In an embodiment, the via openings 422 may be formed with a laser assisted patterning process. As is typical in such processes, sidewalls 451 of the via openings 422 may be tapered. In the case of a dual sided patterning process, the via openings 422 may have a cross-section that is an hourglass shaped cross-section. That is, the midpoints of the via openings 422 are narrower than the ends of the via openings 422. In an embodiment, the via openings 422 may have an aspect ratio of 5:1 or greater, or 10:1 or greater.

In an embodiment, the sub-layer 401A may also include notches 442. The notches 442 may have tapered sidewalls. The notches 442 may extend into, but not through the sub-layer 401A. For example, the notches 442 may have a depth of approximately 10 μm or less, approximately 5 μm or less or approximately 1 μm or less.

Referring now to FIG. 4G, a cross-sectional illustration of the sub-layer 401A after TGVs 420A are plated in the via openings 422 is shown, in accordance with an embodiment. In an embodiment, the TGVs 420A may be plated with any suitable plating process (e.g., electrolytic plating, electroless plating, etc.). In some embodiments, seed layers (not shown) may also be provided along sidewalls of the via openings 422 in order to plate the TGVs 420A. Portions of the seed layer that are over top and bottom surfaces of the sub-layer 401A may be removed with a flash etching process or the like. The TGVs 420A conform to the shape of the via openings 422, and may have an hourglass shaped cross-section. Additionally, the plating process may include the formation of plugs 449 in the notches 442.

Referring now to FIG. 4H, a cross-sectional illustration of the sub-layer 401A after the plugs 449 are removed is shown, in accordance with an embodiment. In an embodiment, the TGVs 420A may be protected above and below by mask layers 460. An etching process may then be used in order to re-expose the notches 442.

Figure 4I:
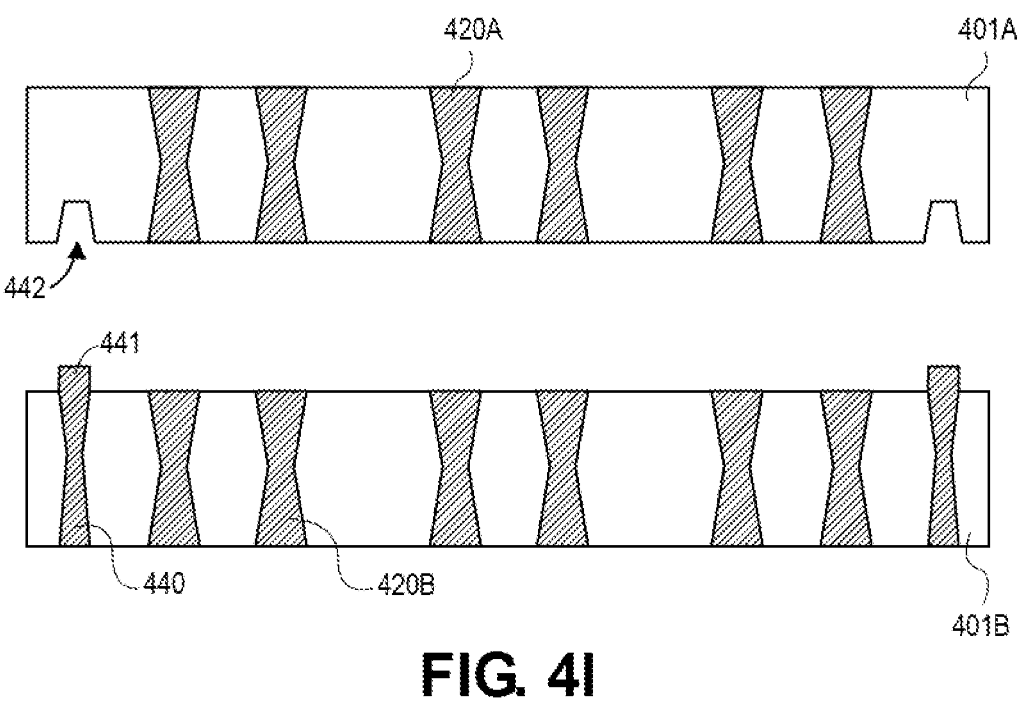

Referring now to FIG. 4I, a cross-sectional illustration of the sub-layer 401A and the sub-layer 401B is shown, in accordance with an embodiment. As shown, the TGVs 420A are aligned over the TGVs 420B with the protrusions 441 aligned with the notches 442.

Figure 4J:
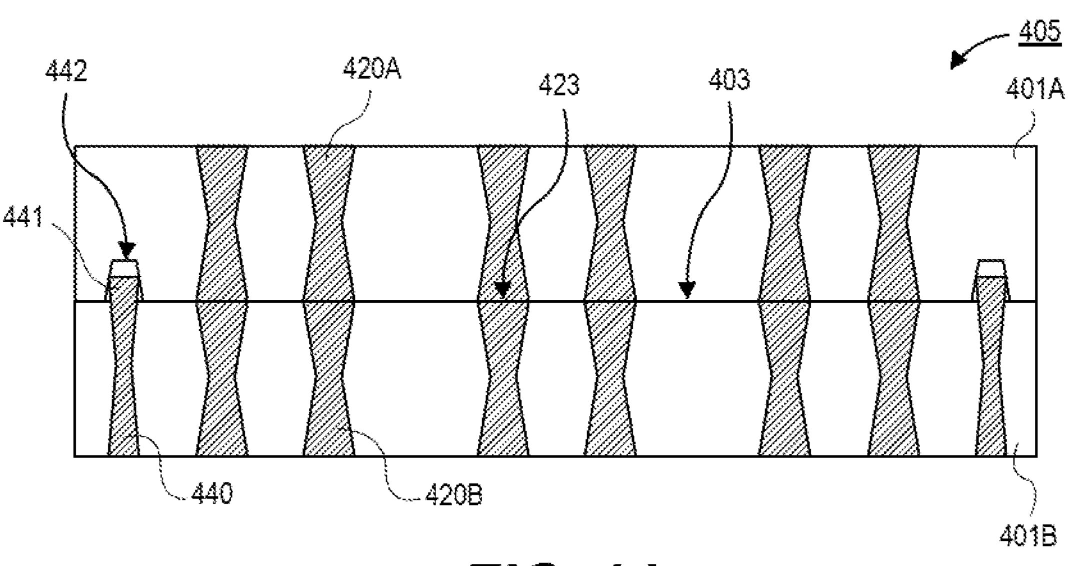

Referring now to FIG. 4J, a cross-sectional illustration of the core 405 after the sub-layer 401A is attached to sub-layer 401B is shown, in accordance with an embodiment. As shown, the alignment is provided by the protrusions 441 being inserted into the notches 442. Therefore, the TGVs 420A are aligned with TGVs 420B. In an embodiment, TGVs 420A are bonded to the TGVs 420B by diffusion bonding. Additionally, the sub-layers 401A and 401B are bonded with a diffusion bonding process. As such, core 405 may be described as having hybrid bonded sub-layers 401A and 401B. In an embodiment, the interface 423 of the TGVs 420A and 420B may be substantially coplanar with the interface 403 between the sub-layers 401A and 401B.

Figure 5:
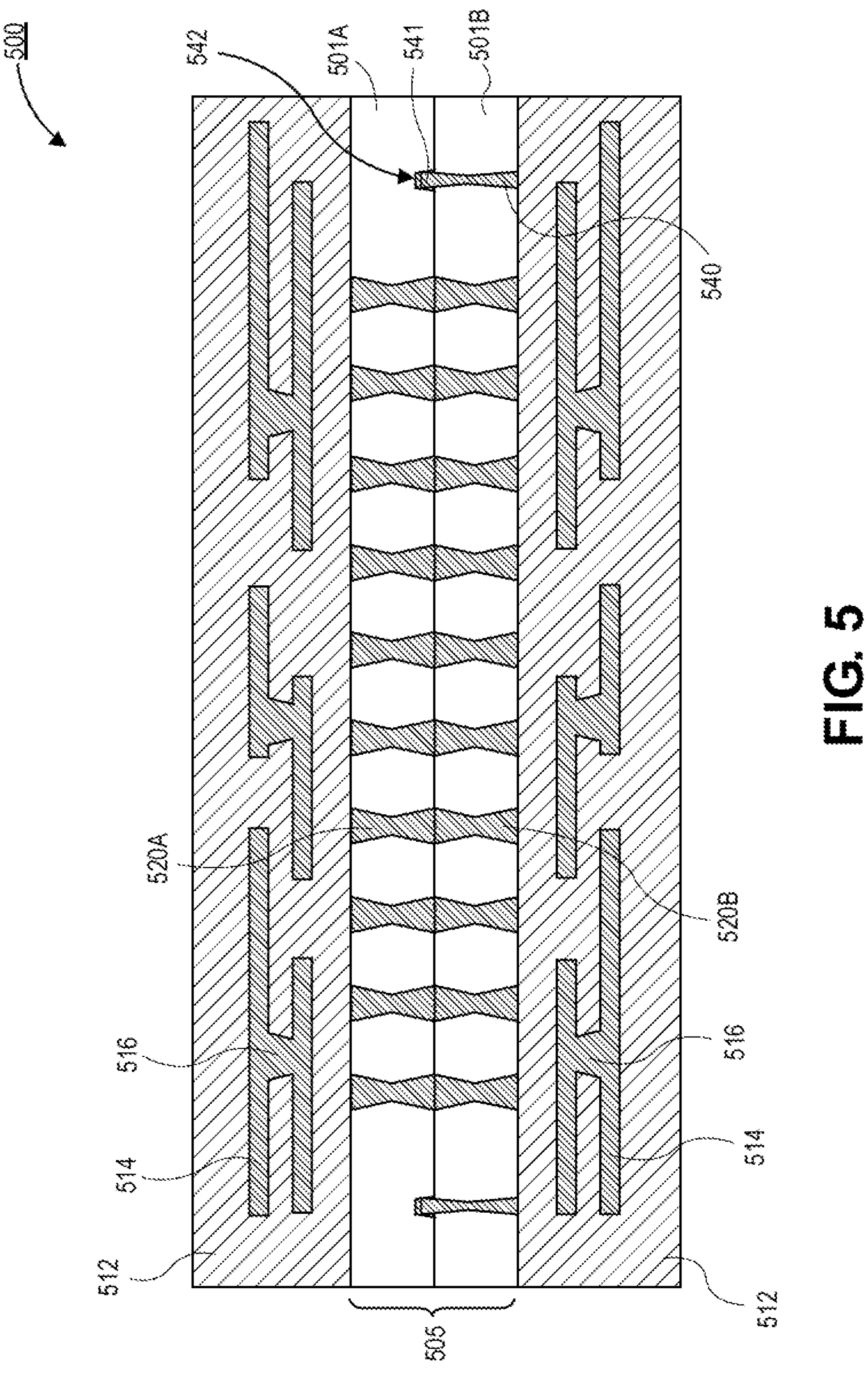
FIG. 5 is a cross-sectional illustration of an electronic package with a glass core that includes aligned TGVs in a pair of glass sub-layers, in accordance with an embodiment.

Referring now to FIG. 5, a cross-sectional illustration of a package substrate 500 is shown, in accordance with an embodiment. In an embodiment, the package substrate 500 may comprise a core 505. The core 505 may comprise two or more sub-layers 520A and 520B. TGVs 520A and 520B may be bonded to each other in order to provide high aspect ratio TGVs 520. In an embodiment, the TGVs 520A and 520B are aligned with each other through an alignment via 540 with a protrusions 541 that is inserted into a notch 542 in the sub-layer 501A. While an alignment feature similar to the alignment feature in FIG. 2 is shown, it is to be appreciated that any of the alignment features disclosed herein may be used in the package substrate 500.

In an embodiment, the package substrate 500 may further comprise buildup layers 512 above and/or below the core 505. The buildup layers 512 may comprise conductive features (e.g., traces 514, vias 516, pads, and the like). In an embodiment, the buildup layers 512 may be an organic material, such as a buildup film or the like.

Figure 6:
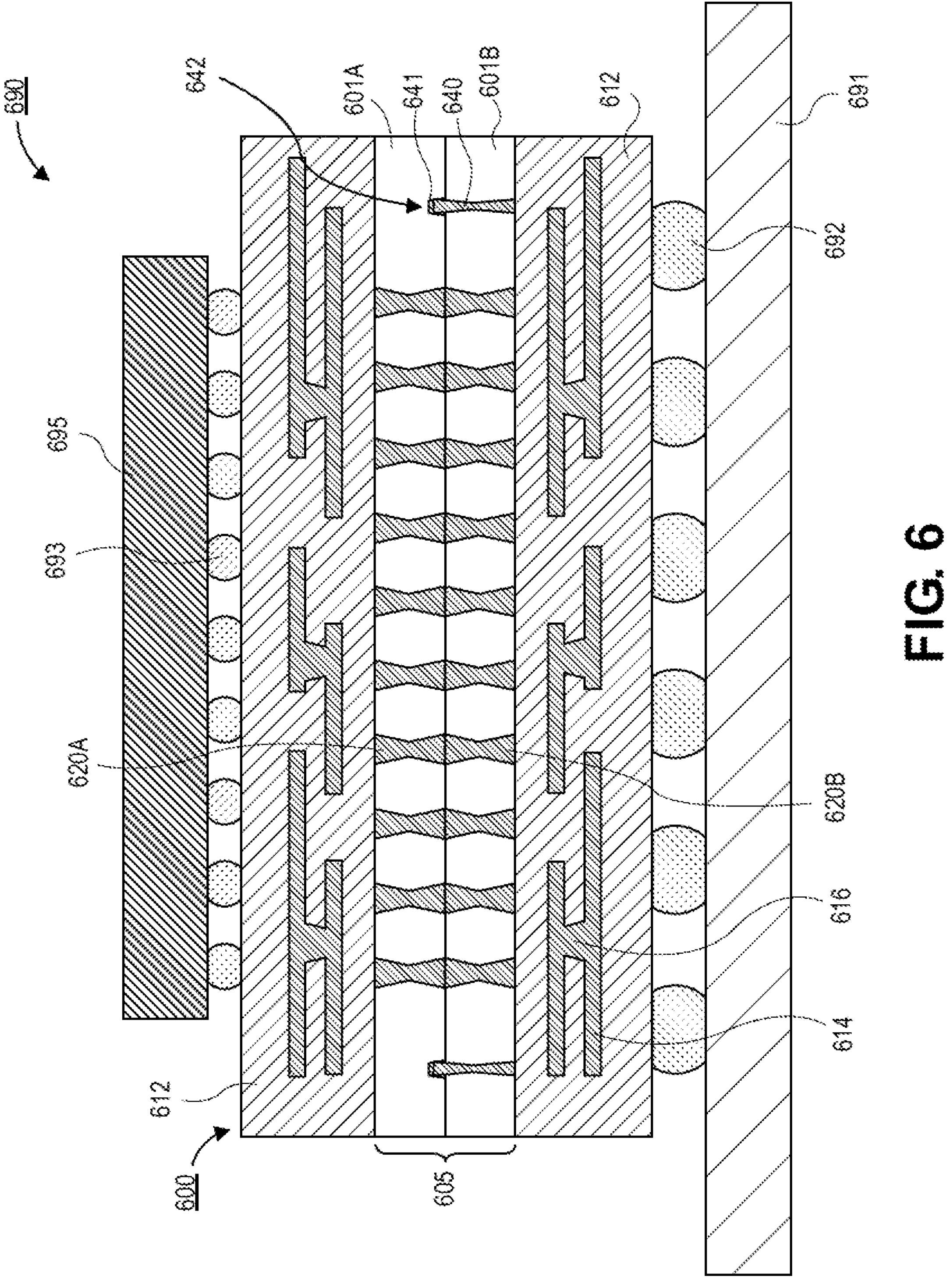
FIG. 6 is a cross-sectional illustration of an electronic system with a glass core that includes aligned TGVs in a pair of glass sub-layers, in accordance with an embodiment.

Referring now to FIG. 6, a cross-sectional illustration of an electronic system 690 is shown, in accordance with an embodiment. In an embodiment, the electronic system 690 comprises a board 691, such as a printed circuit board (PCB). The board 691 may be coupled to a package substrate 600 by interconnects 692. While shown as solder balls, it is to be appreciated that interconnects 692 may be any suitable interconnect architecture.

In an embodiment, the package substrate 600 may comprise a core 605. In the illustrated embodiment, the core 605 includes two or more sub-layers 601A and 601B with TGVs 620A and 620B that are aligned and bonded to each other. An alignment feature (e.g., via 640, protrusion 641, and notch 642) may also be provided in the core 605. While the alignment feature similar to the one shown in FIG. 2 is shown in FIG. 6, it is to be appreciated that the core 605 may include any alignment feature disclosed herein. In an embodiment, buildup layers 612 with pads, traces 614, and vias 616 may be provided above and/or below the core 605.

In an embodiment, one or more dies 695 may be coupled to the package substrate 600. The dies 695 may be any type of dies, such as compute dies, memory dies, or the like. In an embodiment, the dies 695 are coupled to the package substrate 600 by interconnects 693. While solder interconnects 693 are shown in FIG. 6, it is to be appreciated that the interconnects 693 may be any suitable first level interconnect (FLI) architecture.

Figure 7:
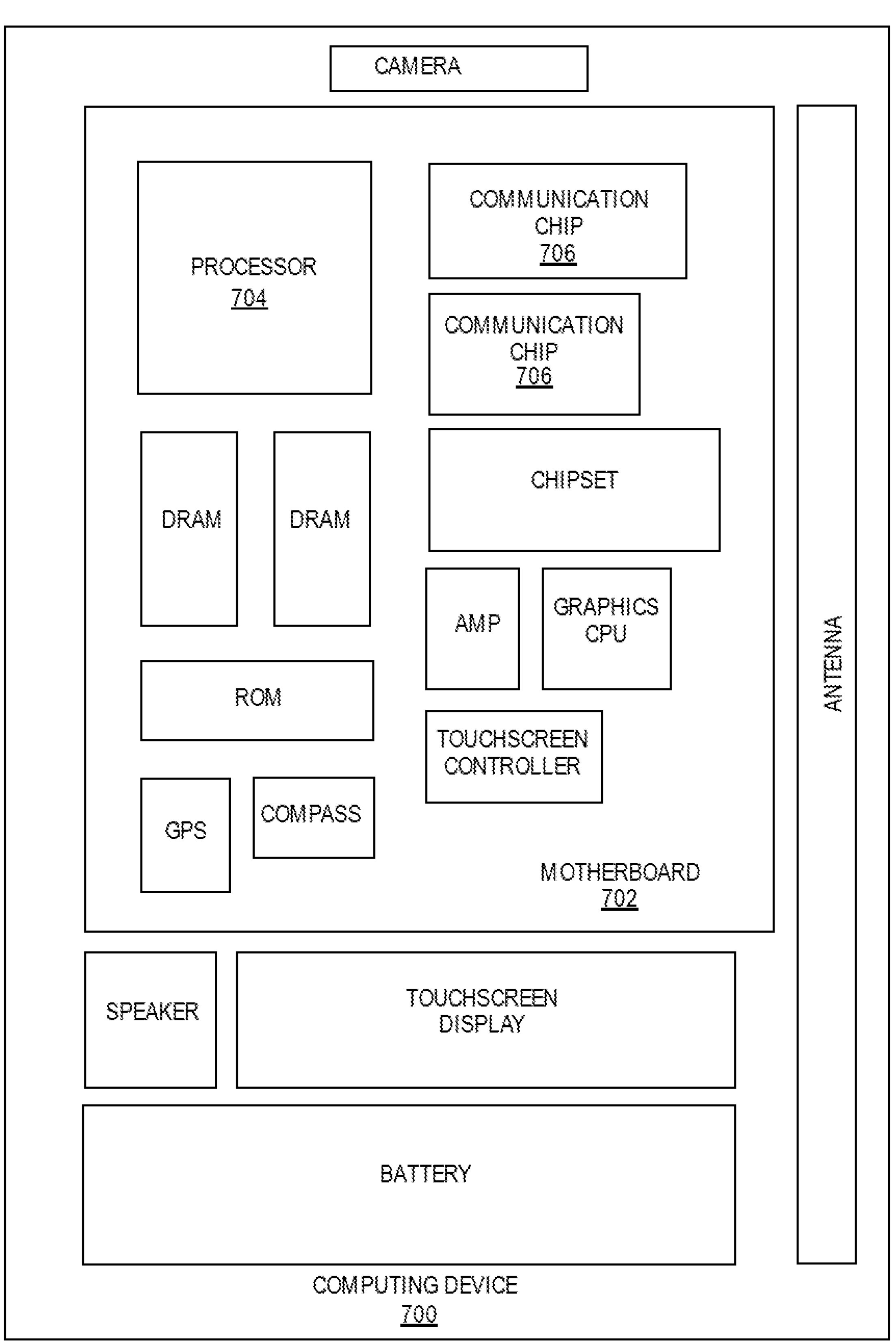
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic system that includes a package substrate with a core comprising two or more sub-layers with aligned TGVs, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic system that includes a package substrate with a core comprising two or more sub-layers with aligned TGVs, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a core for a package substrate, comprising: a first substrate, wherein the first substrate comprises glass; a first through glass via (TGV) through the first substrate; a second substrate, wherein the second substrate comprises glass; and a second TGV through the second substrate, wherein the first TGV is aligned with the second TGV.

Example 2: the core of Example 1, wherein the first TGV extends past a surface of the first substrate, and wherein the second TGV partially fills an opening through the second substrate.

Example 3: the core of Example 2, wherein the first TGV is inserted into the opening.

Example 4: the core of Examples 1-3, wherein the first TGV is directly bonded to the second TGV.

Example 5: the core of Example 4, wherein an interface between the first TGV and the second TGV is below an interface between the first substrate and the second substrate.

Example 6: the core of Examples 1-5, wherein the first TGV is bonded to the second TGV by a solder.

Example 7: the core of Examples 1-6, wherein the first TGV and the second TGV have tapered sidewalls.

Example 8: the core of Example 7, wherein the tapered sidewalls have an hourglass shaped cross-section.

Example 9: the core of Examples 1-8, wherein the first TGV has an aspect ratio of 5:1 or greater, and wherein the second TGV has an aspect ratio of 5:1 or greater.

Example 10: the core of Examples 1-9, wherein the first substrate has a first thickness and the second substrate has a second thickness that is different than the first thickness.

Example 11: the core of Examples 1-10, wherein the first substrate and the second substrate comprise a fused silica glass or a borosilicate glass.

Example 12: a core for a package substrate, comprising: a first substrate, wherein the first substrate comprises glass; first through glass vias (TGVs) through the first substrate; a notch in the first substrate; a second substrate, wherein the second substrate comprises glass; second through glass vias (TGVs) through the second substrate; an alignment via in the second substrate, wherein the alignment via extends up past a surface of the second substrate and is inserted into the notch.

Example 13: the core of Example 12, wherein the first TGVs are aligned with the second TGVs.

Example 14: the core of Example 13, wherein the first TGVs are bonded to the second TGVs with a hybrid bonding process.

Example 15: the core of Examples 12-14, wherein a thickness of the first substrate is equal to a thickness of the second substrate.

Example 16: the core of Examples 12-15, wherein the first TGVs and the second TGVs comprise hourglass shaped cross-sections.

Example 17: the core of Examples 12-16, wherein the alignment via pass entirely through a thickness of the second substrate.

Example 18: the core of Examples 12-17, wherein the alignment notch has a depth up to approximately 10 μm.

Example 19: the core of Examples 12-18, wherein the first TGVs and the second TGVs have aspect ratios of 5:1 or greater.

Example 20: the core of Examples 12-19, wherein the alignment via is narrower than the second TGVs.

Example 21: an electronic package, comprising: a core, wherein the core comprises: a first sub-layer and a second sub-layer; and first TGVs through the first sub-layer and second TGVs through the second sub-layer, wherein the first TGVs are aligned with, and bonded to, the second TGVs; a first buildup layer over the core; and a second buildup layer under the core.

Example 22: the electronic package of Example 21, wherein the first TGVs extend past a surface of the first sub-layer and are inserted into openings in the second sub-layer above the second TGVs.

Example 23: the electronic package of Example 21, further comprising: a notch in the first sub-layer; and an alignment via in the second sub-layer, wherein the alignment via extends past the second sub-layer and is inserted into the notch.

Example 24: an electronic system, comprising: a board; a package substrate coupled to the board, wherein the package substrate comprises: a core with a first sub-layer and a second sub-layer; a first through glass via (TGV) through the first sub-layer; and a second TGV through the second sub-layer, wherein the first TGV is hybrid bonded to the second TGV; and a die coupled to the package substrate.

Example 25: the electronic system of Example 24, wherein the first TGV interfaces with the second TGV below an interface between the first sub-layer and the second sub-layer.

What is claimed is:

1. A core for a package substrate, comprising:

a first substrate, wherein the first substrate comprises glass;

a first through glass via (TGV) through the first substrate, wherein the first TGV extends past a surface of the first substrate;

a second substrate having a surface coupled to the surface of the first substrate, wherein the second substrate comprises glass; and a second TGV through the second substrate, wherein the second TGV is recessed from the surface of the second substrate, wherein the first TGV extends into the second substrate and is aligned and in contact with the second TGV.

2. The core of claim 1, wherein the first TGV is directly bonded to the second TGV.

3. The core of claim 1, wherein the first TGV is bonded to the second TGV by a solder.

4. The core of claim 1, wherein the first TGV and the second TGV have tapered sidewalls.

5. The core of claim 4, wherein the tapered sidewalls have an hourglass shaped cross-section.

6. The core of claim 1, wherein the first TGV has an aspect ratio of 5:1 or greater, and wherein the second TGV has an aspect ratio of 5:1 or greater.

7. The core of claim 1, wherein the first substrate has a first thickness and the second substrate has a second thickness that is different than the first thickness.

8. The core of claim 1, wherein the first substrate and the second substrate comprise a fused silica glass or a borosilicate glass.

9. An electronic package, comprising:

a core, wherein the core comprises:

a first sub-layer and a second sub-layer, the second sub-layer having a surface coupled to a surface of the first sub-layer; and first TGVs through the first sub-layer and second TGVs through the second sub-layer, wherein the first TGVs extend past the surface of the first sub-layer, wherein the second TGVs are recessed from the surface of the second sub-layer, wherein the first TGVs extend into the second sub-layer and are aligned with, and bonded to, the second TGVs;

a first buildup layer over the core; and a second buildup layer under the core.

10. The electronic package of claim 9, wherein the first TGVs extend past a surface of the first sub-layer and are inserted into openings in the second sub-layer above the second TGVs.

11. The electronic package of claim 9, further comprising:

a notch in the first sub-layer; and an alignment via in the second sub-layer, wherein the alignment via extends past the second sub-layer and is inserted into the notch.

* * * * *